US011776815B2

(12) United States Patent
Kudymov et al.

(10) Patent No.: US 11,776,815 B2
(45) Date of Patent: *Oct. 3, 2023

(54) ASYMMETRICAL PLUG TECHNIQUE FOR GAN DEVICES

(71) Applicant: Power Integrations, Inc., San Jose, CA (US)

(72) Inventors: Alexey Kudymov, Ringoes, NJ (US); LinLin Liu, Hillsborough, NJ (US); Jamal Ramdani, Lambertville, NJ (US)

(73) Assignee: Power Integrations, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/824,287

(22) Filed: May 25, 2022

(65) Prior Publication Data

US 2022/0406607 A1    Dec. 22, 2022

Related U.S. Application Data (60) Continuation of application No. 16/857,049, filed on Apr. 23, 2020, now Pat. No. 11,373,873, which is a
(Continued)

(51) Int. Cl.
*H01L 29/20*      (2006.01)
*H01L 29/66*      (2006.01)
(Continued)

(52) U.S. Cl.
CPC ...... *H01L 21/28593* (2013.01); *H01L 23/482* (2013.01); *H01L 29/2003* (2013.01);
(Continued)

(58) Field of Classification Search
CPC ......... H01L 21/28593; H01L 21/76816; H01L 21/76805; H01L 21/823475;
(Continued)

(56) References Cited

U.S. PATENT DOCUMENTS 6,118,154 A * 9/2000 Yamaguchi ......... H01L 27/0251
257/356
6,455,880 B1   9/2002 Ono et al.
(Continued)

FOREIGN PATENT DOCUMENTS

CN    205564759 U    9/2016
JP    2009-200256 A  9/2009
(Continued)

OTHER PUBLICATIONS

European Patent Office, European Patent Application No. 18195756. 4, Extended European Search Report, dated Feb. 1, 2019, 12 pages.
(Continued)

*Primary Examiner* — Natalia A Gondarenko
(74) *Attorney, Agent, or Firm* — Christensen O'Connor Johnson Kindness PLLC (57) ABSTRACT

A method of forming one or more contact regions in a high-voltage field effect transistor (HFET) includes providing a semiconductor material, including a first active layer and a second active layer, with a gate dielectric disposed on a surface of the semiconductor material. A first contact to the semiconductor material is formed that extends through the second active layer into the first active layer, and a passivation layer is deposited, where the gate dielectric is disposed between the passivation layer and the second active layer. An interconnect is formed extending through the first passivation layer and coupled to the first contact. An interlayer dielectric is deposited proximate to the interconnect, and a plug is formed extending into the interlayer dielectric and coupled to the first portion of the interconnect.

24 Claims, 8 Drawing Sheets

Related U.S. Application Data continuation of application No. 16/221,027, filed on Dec. 14, 2018, now Pat. No. 10,665,463, which is a division of application No. 15/713,457, filed on Sep. 22, 2017, now Pat. No. 10,204,791.

(51) Int. Cl.
| | | |
|---|---|---|
| *H01L 29/417* | (2006.01) | |
| *H01L 29/778* | (2006.01) | |
| *H01L 29/205* | (2006.01) | |
| *H01L 23/482* | (2006.01) | |
| *H01L 21/285* | (2006.01) | |

(52) U.S. Cl.
CPC ...... *H01L 29/205* (2013.01); *H01L 29/41766* (2013.01); *H01L 29/66462* (2013.01); *H01L 29/7786* (2013.01); *H01L 29/7787* (2013.01)

(58) Field of Classification Search
CPC ... H01L 29/122–127; H01L 29/15–158; H01L 29/205; H01L 29/778; H01L 29/7787; H01L 29/7835; H01L 29/78624; H01L 29/141766; H01L 29/41725–41791; H01L 29/41775; H01L 29/41783; H01L 29/66575–66598; H01L 23/481; H01L 23/482; H01L 23/5226; H01L 23/525; H01L 23/528; H01L 23/5384; H01L 23/5386; H01L 24/23; H01L 2224/23; H01L 2224/24; H01L 2224/25; H01L 2924/12035; H01L 2924/13064; H01L 29/66659; H01L 29/66431; H01L 29/66462; H01L 29/2003; H01L 29/41766; H01L 29/7786

USPC ... 257/76, 77, 192, 194, 275, 183, 280, 330, 257/355, 356

See application file for complete search history.

(56) References Cited

U.S. PATENT DOCUMENTS

| | | |
|---|---|---|
| 6,649,517 B2 | 11/2003 | Teh et al. |
| 10,050,136 B2 | 8/2018 | Iucolano |
| 11,373,873 B2* | 6/2022 | Kudymov ......... H01L 29/66462 |
| 2008/0149940 A1 | 6/2008 | Shibata et al. |
| 2012/0223317 A1 | 9/2012 | Bahl et al. |
| 2013/0026485 A1* | 1/2013 | Hur ............... H01L 29/417 |
| | | 257/E29.089 |
| 2013/0161692 A1 | 6/2013 | Koudymov |
| 2014/0264452 A1 | 9/2014 | Salih et al. |
| 2015/0132932 A1 | 5/2015 | Green et al. |
| 2016/0086938 A1 | 3/2016 | Kinzer |
| 2017/0015483 A1 | 1/2017 | Park et al. |
| 2017/0154839 A1 | 6/2017 | Lin et al. |

FOREIGN PATENT DOCUMENTS

| | | |
|---|---|---|
| JP | 2011-187946 A | 9/2011 |
| JP | 2013-219273 A | 10/2013 |
| TW | 201342594 A | 10/2013 |
| WO | 2017123999 A1 | 7/2017 |

OTHER PUBLICATIONS

Taiwan Intellectual Property Office, Taiwan Patent Application No. 107132951, Office Action, dated Dec. 29, 2021, 7 pages.

Japanese Notice of Reason for Refusal dated Sep. 13, 2022, in corresponding Japanese Patent Application No. 2018-175459, filed Sep. 19, 2018, 12 pages.

* cited by examiner

ASYMMETRICAL PLUG TECHNIQUE FOR GAN DEVICES

CROSS-REFERENCE TO RELATED APPLICATIONS

This application is a continuation of U.S. application Ser. No. 16/857,049, filed Apr. 23, 2020, which is a continuation of U.S. application Ser. No. 16/221,027, filed Dec. 14, 2018, now U.S. Pat. No. 10,665,463, issued May 26, 2020, which is a divisional of U.S. patent application Ser. No. 15/713,457, filed on Sep. 22, 2017, now U.S. Pat. No. 10,204,791, issued Feb. 12, 2019, which are hereby incorporated by reference.

TECHNICAL FIELD

This disclosure relates generally to semiconductor devices, and more specifically to high voltage heterostructure field effect transistors (HFETs)

BACKGROUND INFORMATION

One type of high voltage field effect transistor (FET) is a heterostructure FET (HFET), also referred to as a high-electron mobility transistor (HEMT). HFETs based on gallium nitride (GaN) and other wide bandgap nitride III materials can be used with electrical devices in high-speed switching and high-power applications (such as power switches and power converters) due to their high electron mobility, high breakdown voltage, and high saturation electron velocity characteristics. These physical properties allow HFETs to change states substantially faster than other semiconductor switches that conduct the same currents at similar voltages. The materials used in the construction of HFETs also allow them to operate at higher temperatures than transistors that use traditional silicon-based technology.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method relating to a contact plug for high voltage devices are described herein. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. In addition, it is appreciated that the figures provided herewith are for explanation purposes to persons ordinarily skilled in the art and that the drawings are not necessarily drawn to scale.

Interconnects and plugs may be used to connect metals separated by passivation, oxide, and/or interlayer dielectric (ILD) layers. For example, interconnects and plugs may be used to couple the ohmic contacts (e.g., the source and drain) of an HFET to their respective metal layers. These metal layers may be disposed above the passivation and ILD layers. The overall thickness of the passivation, oxide, and ILD layers are generally quite thick in order for the HFET to hold voltage without breaking down. In one example, the overall thickness of the passivation, ILD, and/or oxide layers is at least 3.7 micrometers (μm).

In general, a via hole is formed to deposit interconnect metal above the electrical contact to the semiconductor material. This via hole is placed at the center of the ohmic contact and an interconnect is deposited in the via hole. The plug is then formed in the center of the interconnect (which is recessed). When the plug is placed at the middle of the contact, the overall depth of the plug may need to be as deep as the combined thickness of the passivation, ILD, and other oxide layers (e.g., 3.7 μm). One type of plug which may be used is a tungsten plug, also referred to as a W-plug. The depth of the plug is generally limited to about 2 μm due to process constraints. Accordingly, two plugs (one on top of the other) may be needed to reach the equivalent thickness of passivation, ILD, and other oxide layers. The processing steps required to form two stacked plugs may add extra cost to the device as compared to forming one plug. Also by eliminating the two-step plug process, reliability of the process may be increased.

In examples of the present disclosure, an asymmetrical plug interconnect structure is used. One or more passivation layers are formed above the ohmic contact. A via hole is formed in the one or more passivation layers such that interconnect metal may be deposited and couple to the ohmic contact. The interconnect via is formed off-center from the middle axis of the ohmic contact. When the interconnect metal is deposited, a "wing" is formed above the one or more passivation layers, and one or more plugs may be formed above the wing of interconnect metal. In addition, the one or more plugs are formed off-center from the center axis of the ohmic contact, opposite the hole created by the interconnect via. As will be shown, the layout of the plugs and via hole may alternate around the center axis.

Figure 1A:
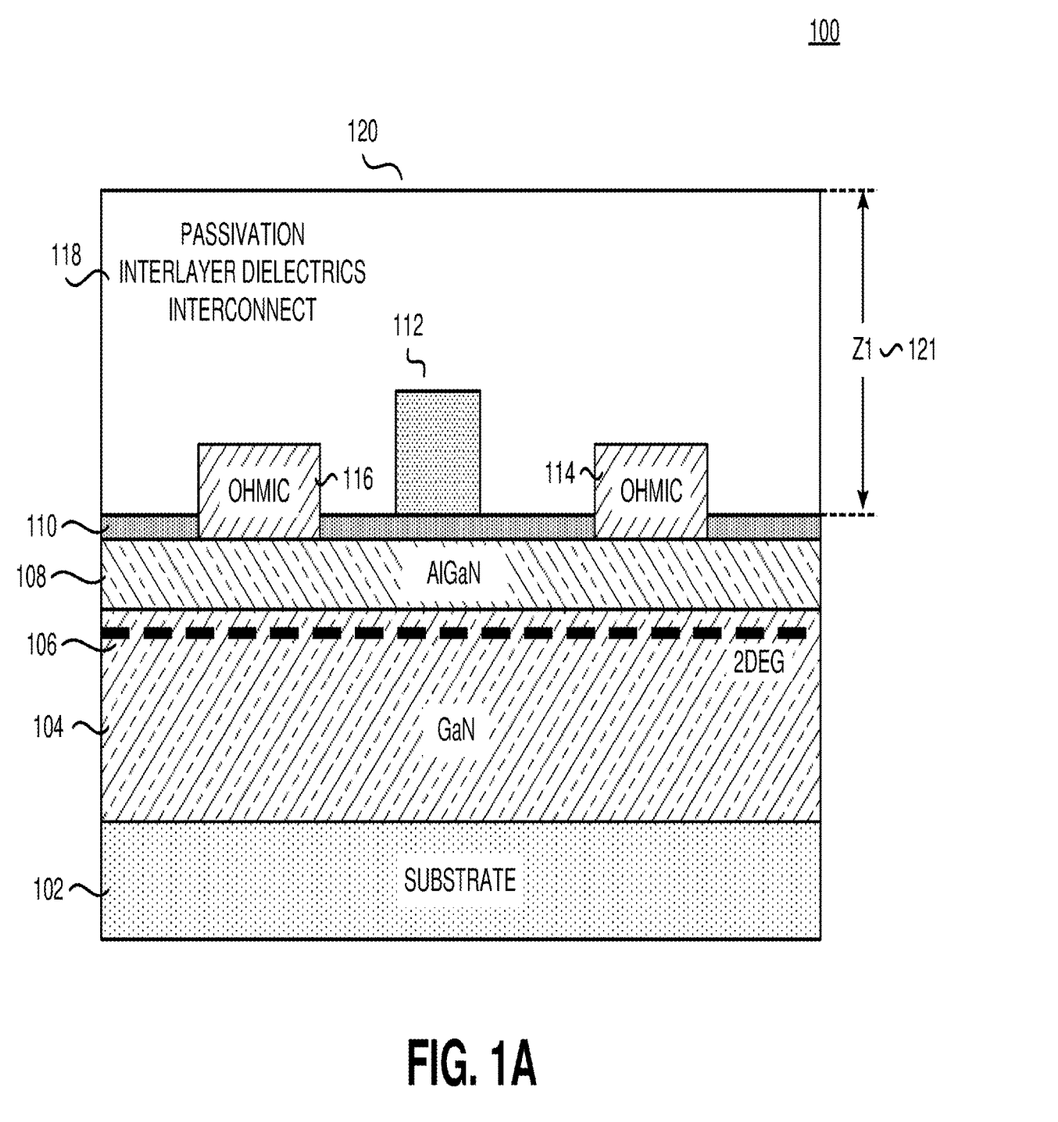
FIG. 1A is a cross-sectional side view of an example semiconductor device which may use an asymmetrical plug interconnect structure, in accordance with an embodiment of the disclosure.

FIG. 1A is a cross-sectional side view of an example semiconductor device 100, which may use an asymmetrical plug interconnect structure. Semiconductor device 100 includes substrate 102, first active layer 104, second active layer 108, gate dielectric 110, gate 112, contacts 114 and 116, passivation/interconnect region 118, and planarized surface 120. Also shown in FIG. 1A is layer of electrical charge 106, which may form between (or proximate to the interface of) first active layer 104 and second active layer 108 due to the bandgap energy difference between the two layers. Layer of electrical charge 106 may define the lateral conductive channel. The layer of electrical charge 106 includes a two-dimensional electron gas (2DEG), since electrons are free to move in two dimensions but are tightly confined in the third dimension. Further, first active layer 104 is sometimes called a channel layer while second active layer 108 is sometimes called the barrier layer or donor layer.

First active layer 104 is disposed over the substrate 102. Second active layer 108 is disposed on first active layer 104. Gate dielectric layer 110 is disposed on second active layer 108. Gate 112 is formed atop gate dielectric layer 110, while contacts 114 and 116 are shown as extending vertically down through gate dielectric 110 to electrically connect to second active layer 108. Contact 114 may be a drain contact while contact 116 may be a source contact. As shown, source and drain ohmic contacts 114 and 116 are laterally spaced-apart, with gate 112 being disposed between source and drain contacts 114 and 116.

First active layer 104 is disposed over substrate 102, and substrate 102 may be formed from materials such as sapphire ($Al_2O_3$), silicon (Si), or silicon carbide (SiC). Various techniques of fabrication may call for layers of other materials to be disposed between substrate 102 and first active layer 120 to facilitate the construction of the device. First active layer 104 may include a first semiconductor material having a first bandgap. In some examples, first active layer 104 may include semiconductor materials containing nitride compounds of group III elements. For example, first active layer 104 may be grown or deposited on substrate 102 and may include GaN.

Second active layer 108 may include a second semiconductor material (e.g., aluminum gallium nitride (AlGaN)) having a second bandgap that is different than the first bandgap of first active layer 104. In other examples, different group III nitride semiconductor materials, such as aluminum indium nitride (AlInN) and aluminum indium gallium nitride (AlInGaN), may be used for second active layer 108. In other examples, second active layer 108 may include a non-stoichiometric compound (e.g., a group III nitride semiconductor material, such as AlXGa1-XN, where 0<X<1). In such materials, the ratios of the elements are not easily represented by ordinary whole numbers. Second active layer 108 may be grown or deposited on first active layer 104.

Gate dielectric 110 may include silicon nitride (SiN) or $Si_3N_4$. In other examples, different nitride-based compounds, such as carbon nitride (CN) or boron nitride (BN), may be used for gate dielectric 110. Although FIG. 1A illustrates a single gate dielectric 110, it should be appreciated that multiple gate dielectric layers may be used, and can include other oxide materials such as aluminum oxide ($Al_2O_3$), hafnium oxide ($HfO_2$), zirconium Oxide ($ZrO_2$), etc. Gate dielectric 110 may be deposited through atomic layer deposition (ALD), or the like.

In the depicted example, gate 112 contacts the gate dielectric 110 and may include a gold nickel (NiAu) stack. In another example, gate 112 may include a titanium gold (TiAu) stack or molybdenum gold (MoAu) stack. In operation, gate 112 controls the forward conduction path between drain terminal (contact 116) and source terminal (contact 114). Contact 116 and contact 114 may include titanium (Ti), molybdenum (Mo), aluminum (Al), or gold (Au). Above the contacts 114/116 and drain 112 is a passivation/interconnect region 118. The passivation/interconnect region 118 may include one or more passivation layers, oxide layers, and interlayer dielectrics (ILDs). The thickness of the passivation/interconnect region 118 is shown as Z1 121. In one example, the thickness Z1 121 may be 3.7 μm or more. Further, metal layers may be disposed on planarized surface 120 at the top of passivation/interconnect region 118. As will be further discussed, the asymmetric plug interconnect structure (not shown) is within the passivation/interconnect region 118 and couples to contacts 114 and 116.

Figure 1B:
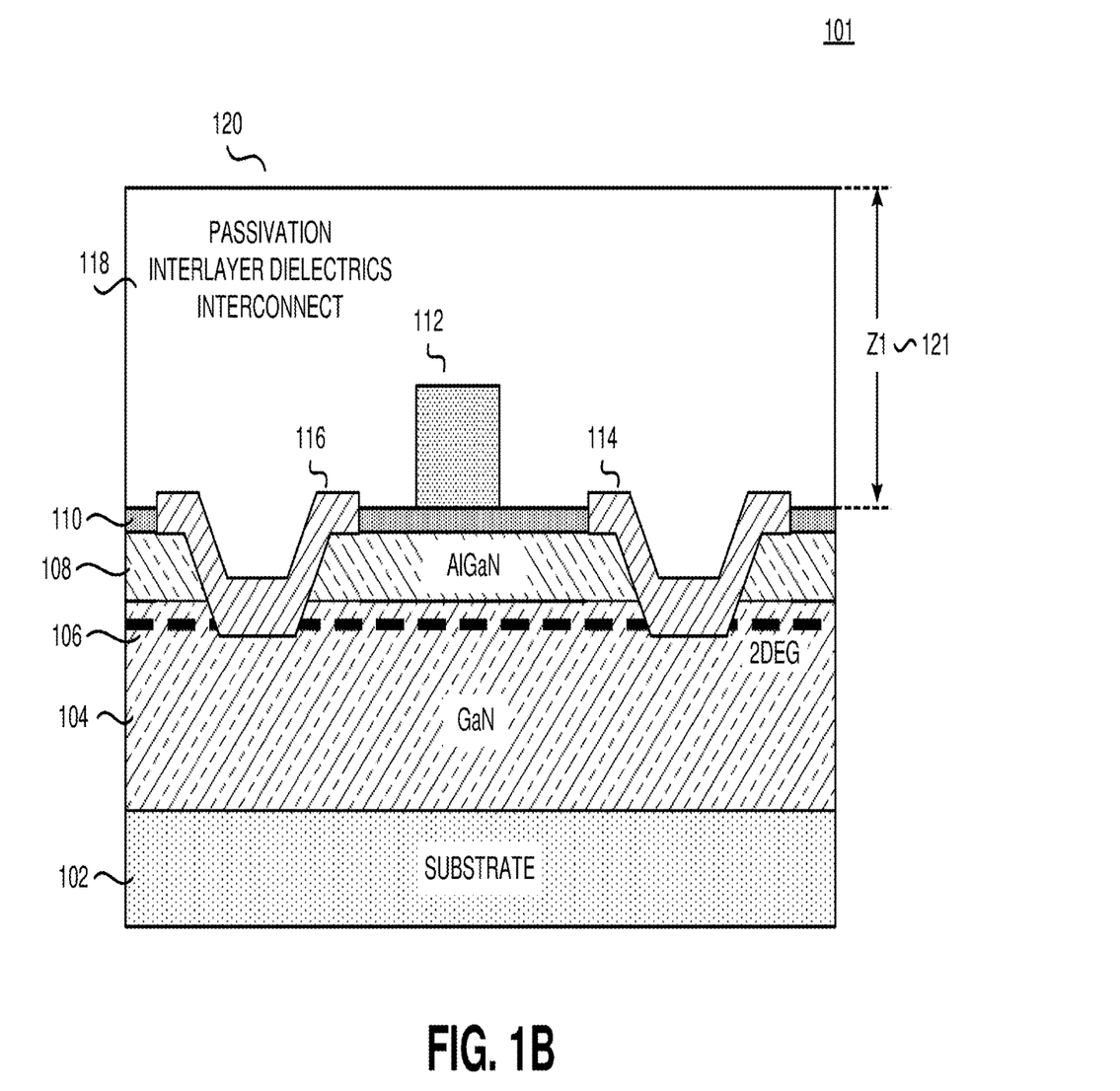
FIG. 1B is a cross-sectional side view of another example semiconductor device which may use an asymmetrical plug interconnect structure, in accordance with an embodiment of the disclosure.

FIG. 1B is a cross-sectional side view of an example semiconductor device 101, which may use an asymmetrical plug interconnect structure. Semiconductor device 101 includes substrate 102, first active layer 104, second active layer 108, gate dielectric 110, gate 112, ohmic contacts 114 and 116, passivation/interconnect region 118, and planarized surface 120. The structure shown for semiconductor device 101 of FIG. 1B is similar to semiconductor device 100 shown in FIG. 1A; however, semiconductor device 101 may be formed using a gold-free process. It should be appreciated that similarly named and numbered elements couple and function as described above; however, in FIG. 1B, ohmic contacts 114 and 116 extend through the gate dielectric 110, second active layer 108, first active layer 104, and intercept electrical charge layer 106. An Ohmic contact forms where the metal of contacts 114/116 intercepts the electrical charge layer 106. Gate 112 may include titanium (Ti), titanium nitride (TiN), and aluminum copper (AlCu), while contacts 114 and 116 may include titanium (Ti), aluminum (Al) or titanium nitride (TiN). As shown, a portion of contacts 114 and 116 sits atop the second active layer 108, while another portion of contacts 114 and 116 extends through second active layer 108, first active layer 104, and electrical charge layer 106. The width of the portion of contacts 114 and 116 that extends through the second active layer 108, first active layer 104, and the electrical charge layer 106, is substantially 2-10 µm. The length of the portion of contacts 114 and 116, that sits atop second active layer 108, is substantially 0.5 µm. As shown, each contact 114 and 116 has two portions that sit atop second active layer 108.

Figure 2:
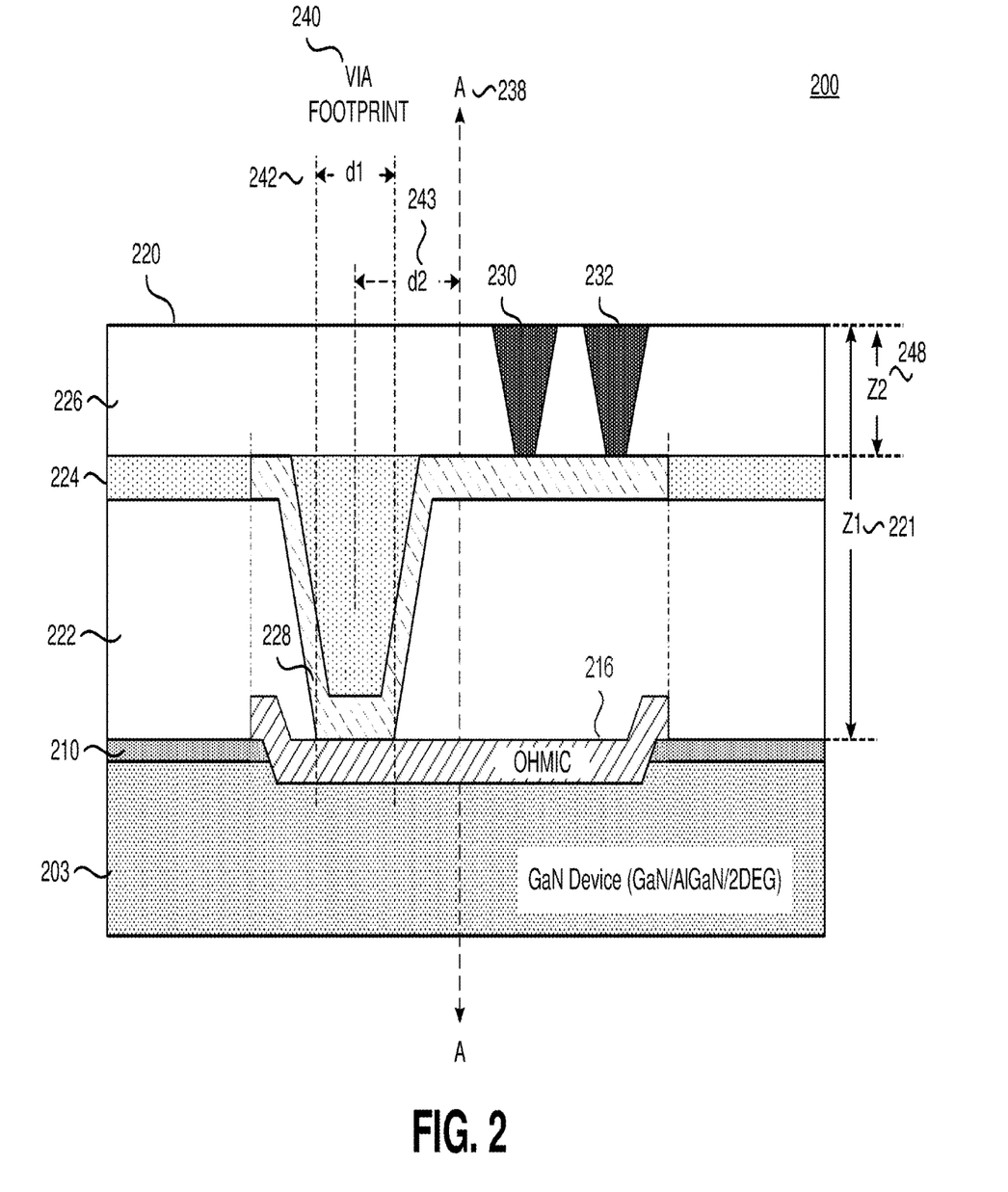
FIG. 2 is a cross-sectional side view of an example semiconductor device with an asymmetric plug interconnect structure, in accordance with an embodiment of the disclosure.

FIG. 2 is a cross-sectional side view if an example semiconductor device 200 with an asymmetric plug interconnect structure. Semiconductor device 200 may include active device 203 (e.g., a simplified view of the semiconductor structure shown in FIGS. 1A and 1B, including the first and second active layers, e.g., GaN/AlGaN, and the electrical charge layer, e.g., 2DEG), gate dielectric 210, contact 216, passivation layer 222, silicon dioxide remnant 224, interlayer dielectric (ILD) 226, interconnect metal 228, and plugs 230 and 232. Further shown in FIG. 2 are thickness Z1 221, axis A 238, via footprint 240, distance d1 242, distance d2 243, and depth Z2 248. As illustrated, the asymmetric plug interconnect structure includes interconnect 228 and plugs 230 and 232.

In the illustrated example, contact region (e.g., the structure of metals and semiconductors used to contact active device 203) includes contact 216 extending through gate dielectric 210 and second active layer, into the first active layer. Contact 216 may be coupled to the layer of electrical charge (see e.g., layer of electrical charge 106 in FIGS. 1A and 1B). Passivation layer 222 is disposed proximate to contact 216 and gate dielectric 210, and at least part of contact 216 is disposed between passivation layer 222 and the second active layer (in active device 203). In some examples, contact 216 forms an ohmic contact with active device 203. More specifically, contact 216 is electrically coupled to supply/withdraw electrons from the electrical charge layer (e.g., electrical charge layer 106 of FIG. 1A). Interconnect 228 extends through passivation layer 222, and is coupled to contact 216. As illustrated, a first portion of interconnect 228 (e.g., the "wing" portion of interconnect 228 that is disposed on, and substantially coplanar with, passivation layer 222) is disposed so that passivation layer 222 is positioned between the first portion of interconnect 228 and the second active layer. Additionally, the first portion of interconnect 228 is substantially laterally coextensive with a first side of contact 216. Conversely, a second portion of interconnect 228 extends through passivation layer 222 to electrically couple to contact 216. As shown, the second portion of interconnect 228 substantially forms a trapezoid, where a first parallel side of the trapezoid includes metal and is coupled to contact 216. As shown, nonparallel sides of the trapezoid include the metal and are in contact with passivation layer 222. The second parallel side of the trapezoid includes an oxide (e.g., remnant 224) and is larger than the first parallel side.

In the depicted example, interlayer dielectric 226 is disposed proximate to interconnect 228, and the first portion of interconnect 228 is disposed between interlayer dielectric 226 and passivation layer 222. Plug 230 and plug 232 (i.e., a plurality of plugs) extend into interlayer dielectric 226, and are coupled to the first portion (e.g., the "wing") of interconnect 228.

In one example, contact 216 (which may include metal) partially sits on top of the gate dielectric layer 210 to form an Ohmic contact with the electrical charge layer in a gold-free process. However, contact 216 can sit on top of the active device 203 when a gold-based process is used.

In another or the same example, passivation layer 222 is disposed above the gate dielectric layer 210, contact 216. Passivation layer 222 may include a nitride-based compound, such as silicon nitride SiN. Although only one passivation layer 222 is shown, multiple passivation layers may be used. Multiple passivation layers may also be interlaced with oxide layers or the like. Passivation/oxide/ILD layers may be deposited using plasma enhanced chemical vapor deposition (PECVD).

In one example, interconnect 228 is disposed above contact 216 and extends through passivation layer 222. Via footprint 240 defines the sidewall/trench of interconnect metal 228. As shown, via footprint 240 is offset from the center of the contact 216 (axis A 238). The center of via footprint 240 is offset from axis A 238 by the distance d2 243. The width of the footprint is shown as distance d1 242. The width d1 242 of the via footprint 240 defines the bottom width of the trench. The top of the trench is wider than the width d1 242 because of the formation process of the via. The metal used for interconnect 228 also forms a "wing" (e.g., the first portion of interconnect 228) on the opposite side of the via along axis A 238. The wing of interconnect 228 is the metal portion of the interconnect 238 which sits above the passivation layer 222. Interconnect 228 is used to couple the contact 216 to other metal layers, which are disposed on the planarized surface 220 (along with plugs 230 and 232).

In another or the same example, silicon dioxide remnant 224 is disposed above the passivation layer 222 and fills the via/trench created by the interconnect metal 228. Tetraethyl orthosilicate (TEOS) may be used to deposit the silicon dioxide to form silicon dioxide remnant 224. However, the silicon dioxide could be deposited using saline-based or disaline-based processes. The silicon dioxide formed using TEOS is generally of lower density and may be utilized for electrical blockage. Similarly, interlayer dielectric (ILD) 226 (e.g., an oxide) is disposed above the TEOS (silicon oxide) remnant 224. The top of interlayer dielectric oxide 226 is planarized to result in planarized surface 220.

In one example, plugs 230 and 232 are disposed through the ILD 226 to contact interconnect 228. Plugs 230 and 232 are attached to interconnect 228 and are disposed in the planarized surface 220 (to couple to other metals layers). In one example, plugs 230 and 232 are tungsten plugs with depth Z2 248. The depth of plugs 230 and 232 are generally limited by the process. In one example, the depth Z2 248 of plug 230 is substantially double the width of plug 230. The total thickness from gate dielectric 210 to planarized surface 220 is shown as thickness Z1 221. In devices where the via footprint is centered in the ohmic contact/along axis A, the plug would need to be deep enough to traverse the entirety of thickness Z1 221. As shown, plugs 230 and 232 are deep enough to reach the wing of interconnect 228 at approximately the depth of the ILD oxide 226, which is much smaller than the thickness Z1 221 and shown as depth Z2 248. This allows simplification of the manufacturing process for the semiconductor device 200.

Figure 3A:
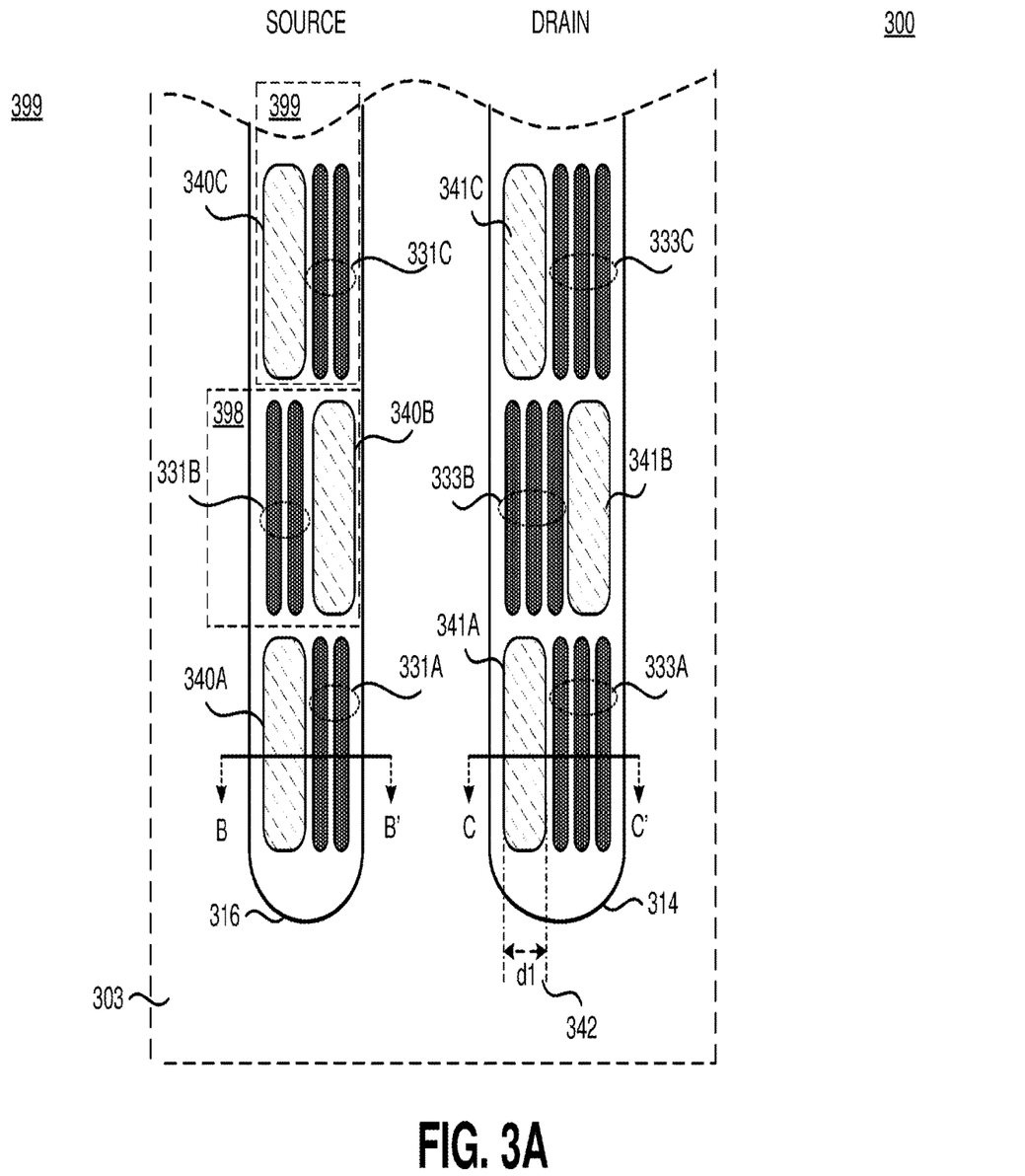
FIG. 3A is a top down view of an example layout of a semiconductor device with an asymmetric plug interconnect structure and alternating via/plug layout, in accordance with an embodiment of the disclosure.

FIG. 3A is a top down view of an example layout of semiconductor device 300 with an asymmetric plug interconnect structure and alternating via/plug layout. Semiconductor device 300 includes a portion of active device 303, contact region 399, an ohmic contact/metal drain footprint 314, ohmic contact/metal source footprint 316, plug footprints 331A, 331B, and 331C for the source, plug footprints 333A, 333B, and 333C for the drain, via footprints 340A, 340B, and 340C for the source, and via footprints 341A, 341B, and 341C for the drain. Further shown in FIG. 3A is also the distance d1 342, which is one example of the width of the via footprint for the drain.

As shown, contact region 399 is included in at least one of a source region (e.g., source contact 316) or a drain region (e.g., drain contact 314) of the HFET—in the depicted example, multiple contact regions 398/399 are included in both the source and drain electrodes and are vertically (with respect to the page orientation) aligned. Also, plugs 331C in contact region 399 are disposed closer to the first side (right hand side of page) of the HFET than second plugs 331B included in a second contact region 398 which are disposed closer to the second side (left hand side) of the HFET. In other words, an orientation of second contact region 398 is a mirror image of contact region 399.

Also, as shown in the depicted example, plugs 331A/331B/331C have a width and a length, where the length of the plug is larger than the width. As shown previously in other figures, the height of plugs 331A/331B/331C is greater than or equal to a thickness of the interlayer dielectric.

The depicted example outlines (large dashed box) a portion of the active device: active area 303 (e.g., first and second active layer and the electrical charge layer). Similarly, a first solid line illustrates the top down outline of drain contact 314 (e.g., the ohmic contact/metal for the drain). As shown, drain contact 314 is generally finger shaped. A second solid line illustrates the top down outline of source contact 316 (e.g., the ohmic contact/metal for the source). As shown, source contact 316 is generally finger shaped.

Via footprint for 340A, 340B, 340C and plug outline 331A, 331B, and 331C for the source 316 are also depicted. As shown, the top down outline for the grouping of plugs 331A, 331B, and 331C is bar shaped. For the example shown, each grouping of plugs 331A, 331B, and 331C includes two bars. To aid in symmetry of current flow between the drain contact 314 and source contact 316, the via footprints 340A, 340B, and 340C are alternated with the grouping of plugs 331A, 331B, and 331C. Via outline 340A is on the left side of source contact 316 while grouping of plugs 331A is on the right side of source contact 316. Conversely, via outline 340B is on the right side of source contact 316 while the grouping of plugs 331B is on the left side (e.g., a mirror image of plugs 331A). Further, via outline 340C is on the left side while the grouping of plugs 331C is on the right side of source contact 316. This mirrored pattern may continue for the entire length of the source contact 316.

In the depicted example, cross-section B-B' is also shown across via footprint 340A and the grouping of plugs 331A. The example semiconductor device 200 shown in FIG. 2 may be one example of the semiconductor device in the cross-section B-B'.

Via footprint for 341A, 341B, 341C and plug outline 333A, 333B, and 333C for the drain contact 314 are also depicted. As shown in top down view, plugs 333A, 333B, and 333C are bar shaped. Each grouping of plugs 333A, 333B, and 333C includes three bars. In general, the width of drain contact 314 is wider than the width of source contact 316. Accordingly, more plugs may be included in drain contact 314. To aid in symmetry of current flow between drain contact 314 and source contact 316, the via footprints 341A, 341B, 341C are alternated with the grouping of plugs 333A, 333B, and 333C. Via outline 341A is on the left side of drain contact 314 while grouping of plugs 333A is on the right side of source contact 316. Conversely, while via outline 341B is on the right side of drain contact 314, while the grouping of plugs 333B is on the left side. Further, via outline 341C is on the left side while grouping of plugs 333C is on the right side of drain contact 314. This pattern may be repeated for the entire length of drain 314. The cross-section along C-C' of the drain is shown in FIG. 3B.

Figure 3B:
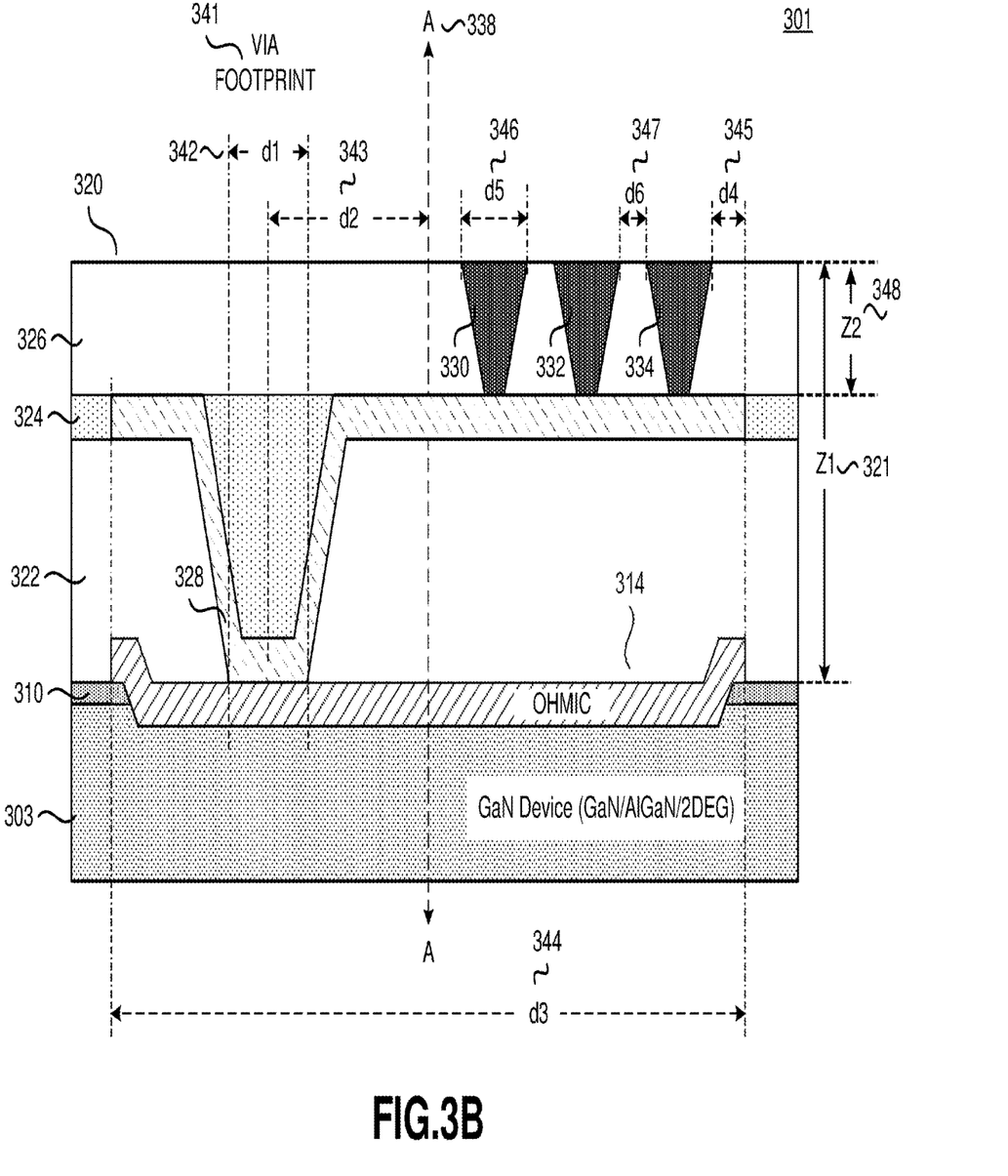
FIG. 3B is a cross-sectional side view of an example semiconductor device with an asymmetric plug interconnect structure, in accordance with an embodiment of the disclosure.

FIG. 3B is a cross-sectional side view of another example semiconductor device 301 with an asymmetric plug interconnect structure. Semiconductor device 301 is cut along the cross-section C-C' in FIG. 3A and includes an asymmetric plug interconnect structure. The structure includes active device 303, gate dielectric 310, ohmic contact 314, passivation layer 322, silicon dioxide (TEOS) remnant 324, interlayer dielectric (ILD) 326, interconnect metal 328, and plugs 330, 332 and 334. Further shown in FIG. 3B are thickness Z1 321, depth Z2 348, axis A 338, via footprint 341, distance d1 342, d2 343, d3 344, d4 345, d5 346, and d6 347. As shown, the active device 303 may include the first and second active layers and electrical charge layer discussed in connection with FIGS. 1A and 1B. For the example shown, the asymmetric plug interconnect structure includes interconnect 328 and plugs 330, 332, and 334. Similarly named and numbered elements couple and function as described above; however, three plugs (330, 332, and 334) are illustrated instead of the two plugs shown in FIG. 2.

It is appreciated that axis A 338 represents the center of ohmic contact 314. Depth Z1 321 represents depth from the planarized surface 320 to the gate dielectric layer 310. Depth Z2 348 represents depth of plugs 330, 332, 334, or the distance from the planarized surface 320 to the TEOS derived silicon oxide 324. The opening width of plugs 330, 332, 334 (shown as distance d5 346) is substantially half the depth of the plugs 330, 332, 334 (shown as depth Z2 348); d5=½ Z2. Distance d1 342 represents the width of the via used to create the trench for interconnect 328. The minimum for distance d1 342 may be substantially 2 μm. Distance d2 343 represents the distance between the center of the via for interconnect 328 and axis A 338. In one example, distance d2 343 is substantially ¼ of distance d3 334. Distance d3 334 represents the length of contact 314. As shown, interconnect 328 may have substantially the same length of contact 314. However, it should be appreciated that the "wing" of interconnect 328 may extend beyond distance d3 334 to form the field plate for contact 314. Distance d4 345 represents the distance between the end of the wing of interconnect 328 and plug 334. This distance may be determined by the processing steps used to fabricate the architectures depicted. Distance d4 345 may be substantially zero and plug 334 starts at the edge of the "wing" of interconnect 328. However, distance d4 345 is dependent on the topography capability of the process to deposit the plugs. Distance d4 345 may be 0.5 μm. Distance d5 346 represents the width of the plug opening. Plugs 330, 332, 334 are wider at the top (planarized surface 320) and taper towards the bottom. In one example, the ratio of the depth of the plug (Z2 348) to the width of the plug opening at the planarized surface 320 is substantially two. In other words, distance d5 346 is substantially half of the depth Z2 348. In one example, the distance d5 346 is substantially 1 μm. Distance d6 347 represents the distance between each plug. In one example, the distance is substantially 0.6 μm.

Figure 4:
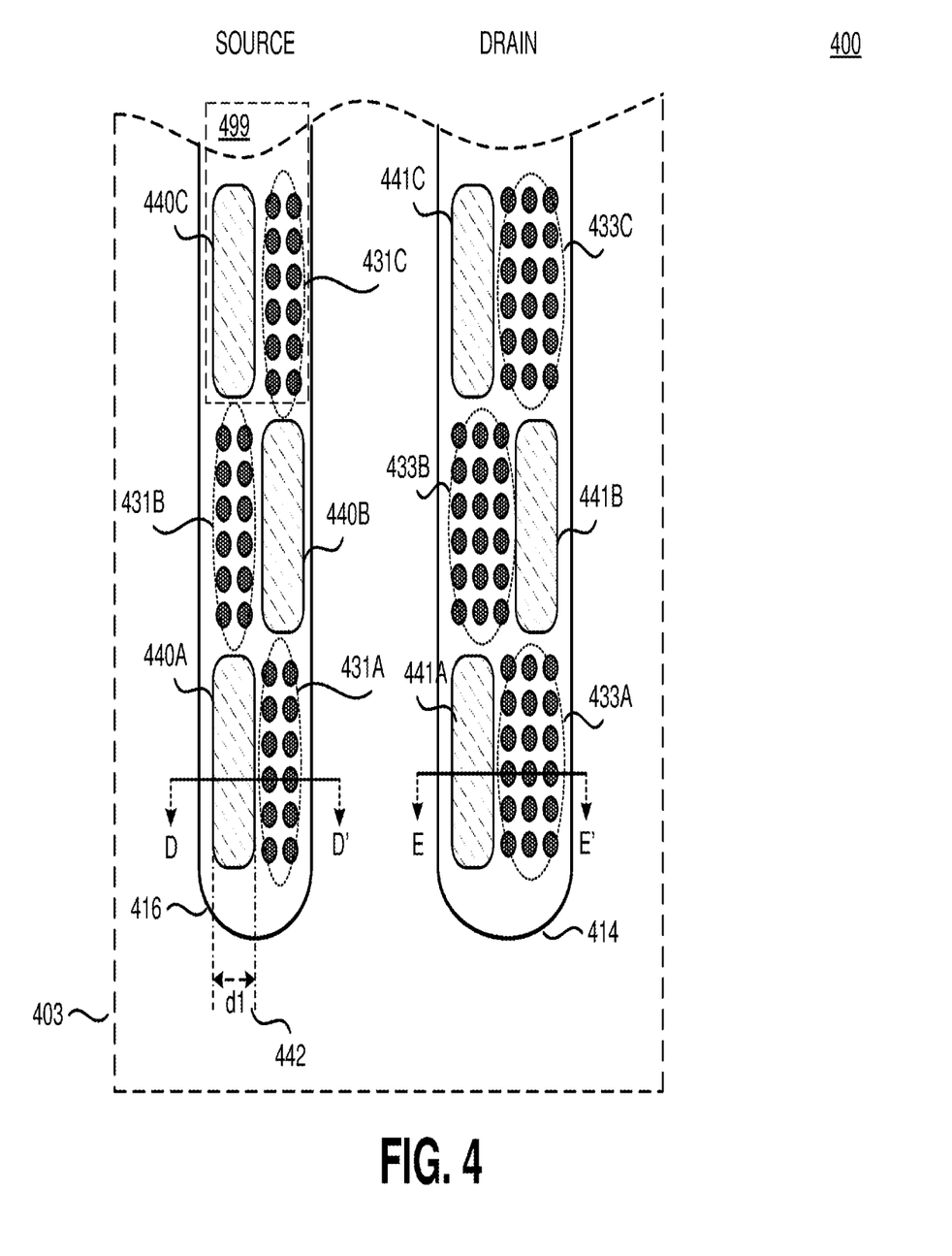
FIG. 4 is a top down view of an example layout of a semiconductor device with an asymmetric plug interconnect structure and alternating via/plug layout, in accordance with an embodiment of the disclosure.

FIG. 4 is a top down view of another example layout of semiconductor device 400 with an asymmetric plug interconnect structure and alternating via/plug layout. Semiconductor device 400 includes a portion of the active device 403, ohmic contact/metal drain footprint 414, ohmic contact/metal source footprint 416, contact region 499, plug footprints 431A, 431B, and 431C for the source, plug footprints 433A, 433B, and 433C for the drain, via footprints 440A, 440B, and 440C for the source, and via footprint 441A, 441B, and 441C for the drain. Further shown in FIG. 4 is distance d1 442, which is one example of the width of the via footprint for source contact 416.

FIG. 4 is similar to FIG. 3A; however, instead of a long continuous bar for the plugs, the plugs shown include a grouping of circles in a line. The cross-section shown in FIG. 2 may be one example of semiconductor device 400 at cross-section D-D'. The cross-section shown in FIG. 3B may be one example of semiconductor device 400 at cross-section E-E'.

Figure 5:
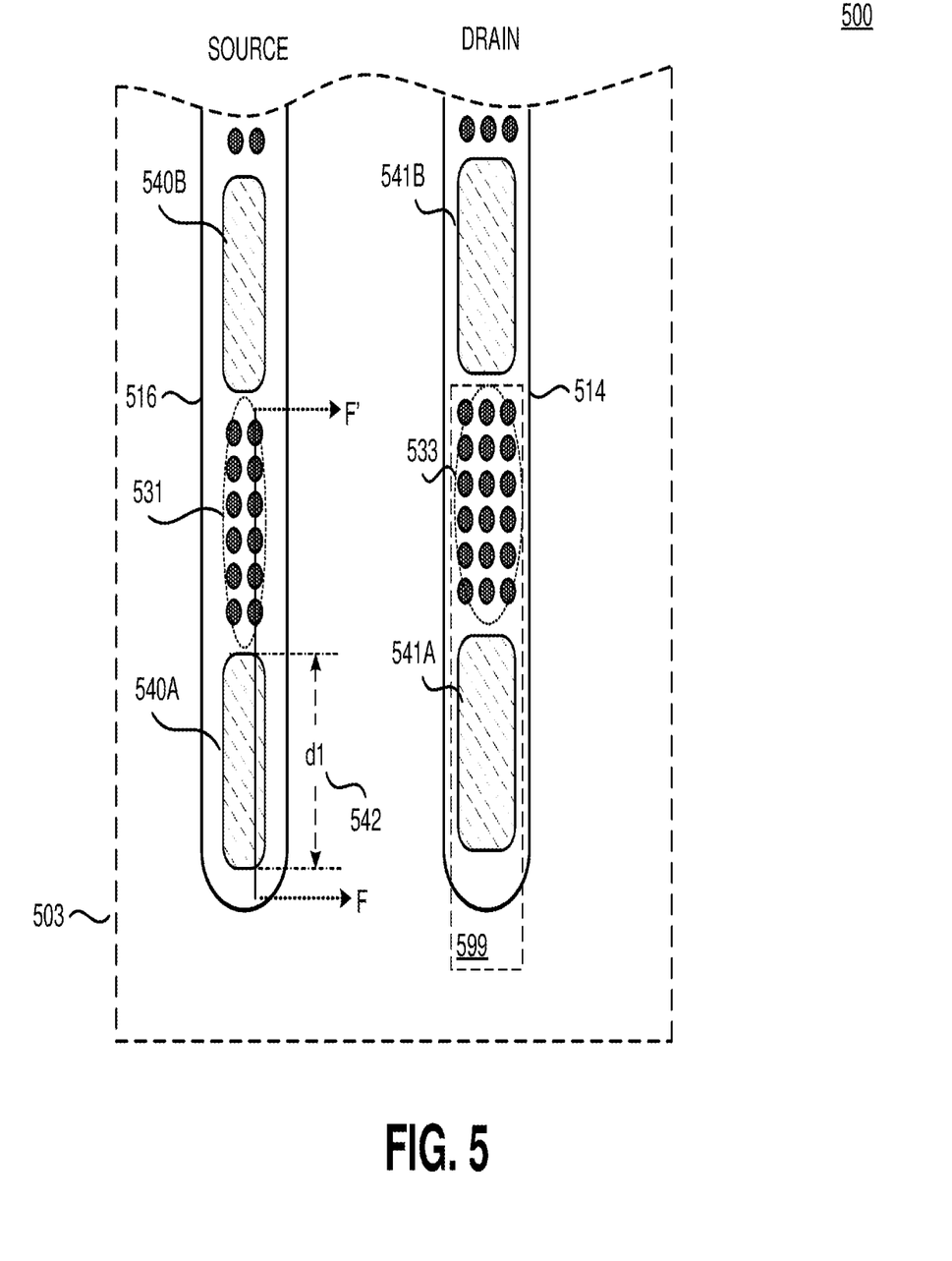
FIG. 5 is a top down view of an example layout of a semiconductor device with an asymmetric plug interconnect structure and alternating via/plug layout, in accordance with an embodiment of the disclosure.

FIG. 5 is a top level view of an example layout of semiconductor device 500 with an asymmetric plug interconnect structure and alternating via/plug layout. Semiconductor device 500 includes a portion of active device 503, ohmic contact/metal drain footprint 514, ohmic contact/metal source footprint 516, contact region 599, plug footprint 531 for the source, plug footprint 533 for the drain, via footprints 540A and 540B for the source, and via footprints 541A and 541B for the drain. Further shown in FIG. 5 is distance d1 542, which is one example of the width of the via footprint for the source contact 516.

FIG. 5 is similar to FIG. 3A and FIG. 4, however, the via and plugs alternate in a different lateral direction than the via and plugs shown in FIG. 3A and FIG. 4. The cross-section of the semiconductor device 500 is similar to the cross-section of the semiconductor devices shown in FIG. 2 and FIG. 3B; however, the device shown in FIG. 5 may have more plugs. For the example shown, there may be six plugs illustrated in the cross-section on the wing of the asymmetrical plug interconnect structure.

Figure 6:
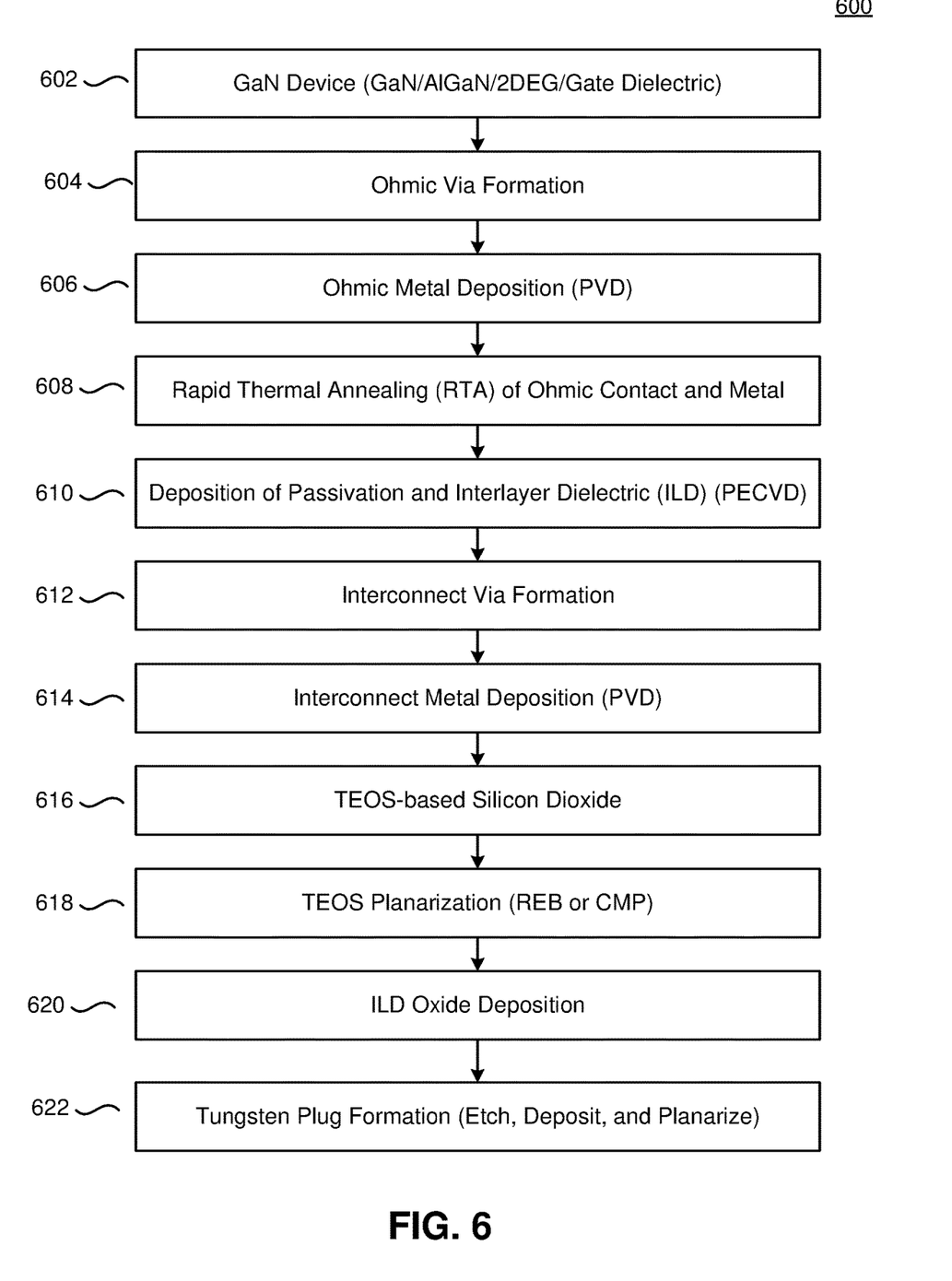
FIG. 6 is an example process flow for fabricating a semiconductor device with an asymmetric plug interconnect structure, in accordance with an embodiment of the disclosure.

FIG. 6 is an example process flow for fabricating a semiconductor device with an asymmetric plug interconnect structure. One of ordinary skill in the art having the benefit of the present disclosure will appreciate that the process flow depicted can occur in any order and even in parallel. Additionally, blocks may be added to, and removed from, the process flow in accordance with the teachings of the present disclosure.

Block 602 illustrates forming the active device including the first and second active layer, and the electrical charge layer. The gate dielectric may also be formed. In some examples, the gate dielectric is disposed on a surface of the semiconductor material, and the second active layer is disposed between the gate dielectric and the first active layer.

Block 604 shows forming a via for an ohmic contact to the semiconductor material. In one example, the via may be etched using inductively coupled plasma (ICP), or the like. The trench that is etched may extend through the gate dielectric, second active layer, and into the first active layer.

Block 606 depicts depositing the metal to form a contact. In one example, a metal is deposited using physical vapor deposition (PVD) and the metal lines the walls of the trench formed in block 604. The metal may extend from the gate oxide to the first active layer.

Block 608 illustrates annealing the metal of the contact between the metal and semiconductor using rapid thermal annealing (RTA) or the like.

Block 610 shows depositing passivation and interlayer dielectrics (ILDs). These layers may be deposited using plasma-enhanced chemical vapor deposition (PECVD).

Block 612 depicts forming a via for the interconnect. This may be achieved by etching a trench through the passivation layer, and the trench may reach the contact.

Block 614 illustrates depositing the metal for the interconnect in the via/trench formed in block 612. In one example, interconnect metal is deposited using physical vapor deposition (PVD). The metal may be deposited in the trench, and on the passivation layer, to form the interconnect. The metal may line the walls of the trench (in a second portion of the interconnect), and (in a first "wing" portion of the interconnect) the metal is substantially coplanar with the passivation layer. The interconnect may extend through the first passivation layer and electrically couple to the first contact. The first portion of the interconnect is disposed on the passivation layer so that the passivation layer is disposed between the first portion of the interconnect and the second active layer. It should be appreciated that in some examples, blocks 610, 612, and 614 may be repeated for multiple passivation layers.

Block 616 illustrates depositing silicon oxide using tetraethyl orthosilicate (TEOS). Depositing tetraethyl orthosilicate (TEOS) on the interconnect may fill a void in the center of the second portion of the interconnect. However, silicon dioxide could be deposited using saline or disaline.

Block 618 shows planarizing residual silicon oxide from the TEOS deposition. In one example, planarization may be done using a resist etch back (REB) process or chemical-mechanical planarization (CMP) process. Once planarized, what is left on the semiconductor device may be referred to as a TEOS-based silicon dioxide.

Block 620 depicts depositing the interlayer dielectric proximate to the interconnect. In one example, the first portion of the interconnect is disposed between the interlayer dielectric and the passivation layer.

Block 622 illustrates forming the plug by etching, depositing, and then planarizing the top surface of the plug. In some examples, the trench that is etched may have a width, a length, and a height, where the length of the trench is larger than the width, and the height is equal to a thickness of the interlayer dielectric. Inductively coupled plasma (ICP) may be used to etch the plug and deposit the plug material (e.g., tungsten) while CMP may be used to planarize the plug. Planarizing may be used to remove residual metal disposed on the surface of the interlayer dielectric.

One of ordinary skill in the art, having the benefit of the present disclosure, will appreciate that the process flow depicted may be repeated many times to form a plurality of contact regions including the one or more contact regions. In some of these examples, a first plug may be disposed closer to a first side of the HFET than a second plug in a second contact region, and the second plug is disposed closer to a second side, opposite the first side, of the HFET. In other words, the orientation of the second contact region may be a mirror image of the first contact region.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A high-voltage field effect transistor (high-voltage FET), comprising:
    a first active layer including a first semiconductor material having a first bandgap; and
    a second active layer including a second semiconductor material having a second bandgap;
    a gate dielectric disposed proximate to the second active layer, wherein the second active layer is disposed between the first active layer and the gate dielectric; and
    a plurality of contact regions of a contact footprint of a source region or a drain region of the high-voltage FET, each contact region including:
        a contact coupled to supply or withdraw charge from the high-voltage FET;
        a passivation layer disposed proximate to the contact and the gate dielectric, wherein at least part of the contact is disposed between the passivation layer and the second active layer;
        an interconnect extending through the passivation layer and coupled to the contact at a via footprint region, wherein a first portion of the interconnect is disposed on the passivation layer so that the passivation layer is disposed between the first portion of the interconnect and the second active layer; and
        a plurality of plugs coupled to the first portion of the interconnect,
        wherein, for individual contact regions, a location of the plurality of plugs with respect to their corresponding via footprint region alternates along a same contact footprint from one contact region to another contact region, wherein, in a vertical direction, the location of the plurality of plugs is orthogonally offset from their corresponding via footprint region.

2. The high-voltage FET of claim 1, wherein a location of the via footprint region and the location of the plurality of plugs alternate in different lateral directions.

3. The high-voltage FET of claim 2, wherein the location of the via footprint region and the location of the plurality of plugs share a same horizontal direction.

4. The high-voltage FET of claim 1, wherein the first portion of the interconnect includes a wing structure disposed off of a center axis of the interconnect.

5. The high-voltage FET of claim 4, wherein the plurality of plugs are coupled to the wing structure, and wherein center axes of individual plugs of the plurality of plugs are disposed away from the center axis of the via footprint region.

6. The high-voltage FET of claim 1, further comprising an interlayer dielectric disposed proximate to the interconnect, wherein the first portion of the interconnect is disposed between the interlayer dielectric and the passivation layer.

7. The high-voltage FET of claim 6, wherein the plurality of plugs extends into the interlayer dielectric.

8. The high-voltage FET of claim 7, wherein individual plugs of the plurality of plugs have a width, a length, and a height, wherein the length of an individual plug is larger than the width, and wherein the height is greater than or equal to a thickness of the interlayer dielectric.

9. The high-voltage FET of claim 1, further comprising a layer of electrical charge formed proximate to the first active layer and the second active layer in response to a difference in bandgap energy between the first bandgap and the second bandgap.

10. The high-voltage FET of claim 1, wherein the passivation layer is disposed between the contact and the first portion of the interconnect, and wherein the first portion of the interconnect is substantially laterally coextensive with a first side of the contact.

11. The high-voltage FET of claim 1, wherein a second portion of the interconnect extends through the passivation layer, and the first portion of the interconnect is substantially coplanar with the passivation layer.

12. The high-voltage FET of claim 11, wherein the second portion of the interconnect substantially forms a trapezoid, wherein a first parallel side of the trapezoid includes metal and is coupled to the contact, wherein nonparallel sides of the trapezoid include the metal, and wherein a second parallel side of the trapezoid includes an oxide and is larger than the first parallel side.

13. The high-voltage FET of claim 1, wherein the plurality of contact regions comprises:
    a first contact region included in the source region of the high-voltage FET, and
    a second contact region included in the drain region of the high-voltage FET,
    wherein a footprint of the second contact region is wider than a footprint of the first contact region.

14. The high-voltage FET of claim 13, wherein the plurality of plugs are disposed away from a recess in the interconnect.

15. A high-voltage field effect transistor (high-voltage FET), comprising:
    a first active layer including a first semiconductor material having a first bandgap; and
    a second active layer including a second semiconductor material having a second bandgap;
    a gate dielectric disposed proximate to the second active layer, wherein the second active layer is disposed between the first active layer and the gate dielectric; and
    a plurality of contact regions of a contact footprint of a source region or a drain region of the high-voltage FET, each contact region including:
        a contact coupled to supply or withdraw charge from the high-voltage FET;
        a passivation layer disposed proximate to the contact and the gate dielectric, wherein at least part of the contact is disposed between the passivation layer and the second active layer;
        interconnecting means extending through the passivation layer and coupled to the contact at a via footprint region, wherein a first portion of the interconnecting means is disposed on the passivation layer so that the passivation layer is disposed between the first portion of the interconnecting means and the second active layer; and
        a plurality of plugs coupled to the first portion of the interconnecting means,
        wherein, for individual contact regions, a location of the plurality of plugs with respect to their corresponding via footprint region alternates along a same contact footprint from one contact region to another contact region, and wherein, in a vertical direction, the location of the plurality of plugs is orthogonally offset from their corresponding via footprint region.

16. The high-voltage FET of claim 15, wherein a location of the via footprint region and the location of the plurality of plugs alternate in different lateral directions.

17. The high-voltage FET of claim 16, wherein the location of the via footprint and the location of the plurality of plugs share a same horizontal direction.

18. The high-voltage FET of claim 15, wherein the first portion of the interconnecting means includes a wing structure disposed off of a center axis of the interconnecting means.

19. The high-voltage FET of claim 18, wherein the plurality of plugs are coupled to the wing structure.

20. The high-voltage FET of claim 15, wherein a second portion of the interconnecting means extends through the passivation layer, and the first portion of the interconnecting means is substantially coplanar with the passivation layer.

21. The high-voltage FET of claim 15, wherein center axes of individual plugs of the plurality of plugs are disposed away from a center axis of the via footprint region.

22. The high-voltage FET of claim 15, wherein the plurality of contact regions comprises:

a first contact region included in the source region of the high-voltage FET, and a second contact region included in the drain region of the high-voltage FET, wherein a footprint of the second contact region is wider than a footprint of the first contact region.

23. The high-voltage FET of claim 22, wherein the first contact region includes a first plurality of plugs, and the second contact region includes a second plurality of plugs, and wherein the second plurality of plugs is greater than the first plurality of plugs.

24. The high-voltage FET of claim 13, wherein the first contact region includes a first plurality of plugs, and the second contact region includes a second plurality of plugs, and wherein the second plurality of plugs is greater than the first plurality of plugs.

* * * * *